(12) United States Patent
Cartlidge

(10) Patent No.: US 7,545,431 B2
(45) Date of Patent: *Jun. 9, 2009

(54) SYSTEM AND METHODS FOR INCREASING FILL-FACTOR ON PIXELATED SENSOR ARRAYS

(75) Inventor: Andrew G. Cartlidge, 22 Commodore Pl., Palm Beach Gardens, FL (US) 33418

(73) Assignees: Andrew G. Cartlidge, Palm Beach Gardens, FL (US); Himanshu S. Amin, Solon, OH (US); Daniel B. Bortnick, Mentor, OH (US); Gregory Turocy, Moreland Hills, OH (US)

( * ) Notice: Subject to any disclaimer, the term of this patent is extended or adjusted under 35 U.S.C. 154(b) by 64 days.

This patent is subject to a terminal disclaimer.

(21) Appl. No.: 11/555,374

(22) Filed: Nov. 1, 2006

(65) Prior Publication Data

US 2007/0058071 A1    Mar. 15, 2007

Related U.S. Application Data

(63) Continuation of application No. 10/838,471, filed on May 4, 2004, now Pat. No. 7,158,181.

(51) Int. Cl.
 *H04N 5/225* (2006.01)
 *G02B 13/20* (2006.01)
(52) U.S. Cl. .................. 348/340; 359/707
(58) Field of Classification Search ............... 359/15, 359/599, 707; 257/436; 348/335, 340
 See application file for complete search history.

(56) References Cited

U.S. PATENT DOCUMENTS

| | | | |
|---|---|---|---|
| 4,323,925 A | 4/1982 | Abell et al. | |
| 5,534,386 A | 7/1996 | Peterson et al. | |
| 5,754,226 A | 5/1998 | Yamada et al. | |
| 5,920,345 A | 7/1999 | Sauer | |
| 6,058,281 A | 5/2000 | Castenmiller | |
| 6,166,389 A | 12/2000 | Shie et al. | |
| 6,225,670 B1 | 5/2001 | Dierickx | |
| 6,266,476 B1 | 7/2001 | Shie et al. | |
| 6,301,051 B1 | 10/2001 | Sankur | |
| 6,307,243 B1 | 10/2001 | Rhodes | |
| 6,326,998 B1 | 12/2001 | Palum | |
| 6,381,007 B2 * | 4/2002 | Fabre et al. | 348/298 |

(Continued)

OTHER PUBLICATIONS

International Search Report for PCT/US05/15215 dated Feb. 24, 2006.

*Primary Examiner*—Lin Ye
*Assistant Examiner*—Jason Whipkey
(74) *Attorney, Agent, or Firm*—Turocy & Watson, LLP

(57) ABSTRACT

A system and methodology that facilitates increasing the fill-factor of digital sensor arrays at a reduced cost. In general, fill-factor relates to the active area of the sensor array with respect to the inactive area or space between pixels on the array. By increasing the fill-factor, transmitting maximum amount of optical information to the array is enabled while mitigating information loss between pixels on the array. An image detector system is provided that includes a pixelated sensor array that is responsive to electromagnetic radiation. A coherent scattering medium diffuses the electromagnetic radiation with respect to the pixelated sensor array in order to increase the fill-factor of the array.

20 Claims, 4 Drawing Sheets

U.S. PATENT DOCUMENTS

| | | |
|---|---|---|
| 6,400,402 B1 | 6/2002 | Iwanaga |
| 6,529,678 B2 | 3/2003 | Shie et al. |
| 6,535,249 B1 | 3/2003 | Stavely |
| 6,567,122 B1 | 5/2003 | Anderson et al. |
| 6,624,850 B1 | 9/2003 | Guidash |
| 6,778,728 B2 | 8/2004 | Taylor et al. |
| 6,859,229 B1 | 2/2005 | Suda |
| 2004/0223071 A1 | 11/2004 | Wells et al. |
| 2005/0030409 A1 | 2/2005 | Matherson et al. |

\* cited by examiner

SYSTEM AND METHODS FOR INCREASING FILL-FACTOR ON PIXELATED SENSOR ARRAYS

RELATED APPLICATIONS

This application is a continuation of U.S. patent application Ser. No. 10/838,471 which was filed May 4, 2004 entitled SYSTEM AND METHODS FOR INCREASING FILL-FACTOR ON PIXELATED SENSOR ARRAYS.

TECHNICAL FIELD

The present invention relates generally to image and optical systems, and more particularly to a system and method to facilitate sensor array performance and design by associating a coherent scattering medium with a pixelated sensor array.

BACKGROUND OF THE INVENTION

One area of concern to sensor array manufacturers is that of ensuring that the active area of their respective products (the pixel) covers the maximum amount of area such that there are substantially no gaps or minimal gaps between pixels. This amount of coverage is usually described as a percentage "fill-factor" and is computed as follows: fill-factor %=(pixel-pixel area)/(pixel active area)*100. In general, it is very difficult to achieve 100% fill-factor, and in some cases, the array process generally does not allow a large fill-factor such as is the case with CMOS sensor technology, for example. There are two primary reasons for achieving the goal of a high fill-factor which include:

1) To facilitate that a majority photons incident on the array are captured by the active parts of the array (i.e., increase sensitivity), and, 2) To facilitate that small structures in an image as presented to the array are not "lost in the spaces between pixels" whereby photons correlated with small structures are thus not captured by the active part of the pixel.

Some manufacturers have attempted to achieve a large effective fill-factor by the application of arrays of lenslets to the surface of the sensor array. This approach has the advantage of increasing the effective fill-factor and the sensitivity of the array, but suffers from chromatic effects. Also, lenslet processes by nature pose numerous difficulties in precise manufacture of micron-sized lenslets, and the associated problems in precise positioning. Therefore, lenslet style solutions add significant cost to the overall production of sensor arrays.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention relates to a system and methodology that facilitates imaging performance of digital sensor arrays by associating a coherent scattering medium or component with a sensor array to achieve an optimized fill-factor for the array (e.g., effective 100% fill-factor). The coherent scattering medium acts to diffuse photons that may fall in the spaces of the array and thus enable image details that may have been lost by conventional approaches to be detected by the array. In addition to capturing these details, the present invention allows for lower cost assembly of sensor arrays by mitigating the addition of complex components such as lenslets that are also difficult to manufacture and position.

In one aspect of the present invention, a holographic diffuser, for example, is placed in proximity of a sensor array having a plurality of pixels (e.g., CMOS array, CCD array, and so forth) such that the diffuser creates a virtual point source with a diffusion angle such that a substantially-sharp point (e.g., infinitely-sharp point) present on the diffuser is then diffused or spread to cover about one pixel pitch which provides coherent spatial coupling between active and inactive areas of the sensor array. Thus, any information that may have been lost in the spaces between pixels is spread out across inactive or "dead-space" in order to fall on the active portions of the pixels. In other words, the dead-space has been effectively removed, and the array can achieve an "effective 100% fill-factor." Also, the absolute resolution of the system can remain unchanged, as a diffused cone emanating from the diffuser can be engineered to generally not cover more than one pixel-pitch and thus preserving resolution.

In a system design example employing the subject diffuser (e.g., camera, copier, fax, microscope, telescope, video), relatively low-cost sensors can be made to perform (or outperform) very expensive and high-fill-factor sensors currently available. Additionally, highly pixelated arrays can be optimized for fill-factor performance by replacing expensive lenslet arrays with the coherent scattering medium of the present invention.

The following description and the annexed drawings set forth in detail certain illustrative aspects of the invention. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DETAILED DESCRIPTION OF THE INVENTION

The present invention relates to a system and methodology that facilitates increasing the fill-factor of digital sensor arrays at a reduced cost. In general, fill-factor relates to the active area of the sensor array with respect to the inactive area or space between pixels on the array. By increasing the fill-factor, the present invention enables transmitting maximum amount of optical information to the active portions of the array while mitigating information loss between pixels on the array. In one aspect of the present invention, an image detector system is provided. The system includes a pixelated sensor array that is responsive to electromagnetic radiation such as visible light, for example. A coherent scattering medium diffuses the electromagnetic radiation with respect to the pixelated sensor array in order to increase the fill-factor of the array.

Systems adapted in accordance with the present invention can include digital image processing from the respective sensors, if desired, along with storage (e.g., local database, image data transmissions to remote computers for storage/analysis) and display of the images produced in accordance with the present invention (e.g., computer display, printer, film, and other output media). Remote signal processing of image data from the sensors can be provided, along with communication and display of the image data via associated data packets that are communicated over a network or other medium, for example.

Figure 1:
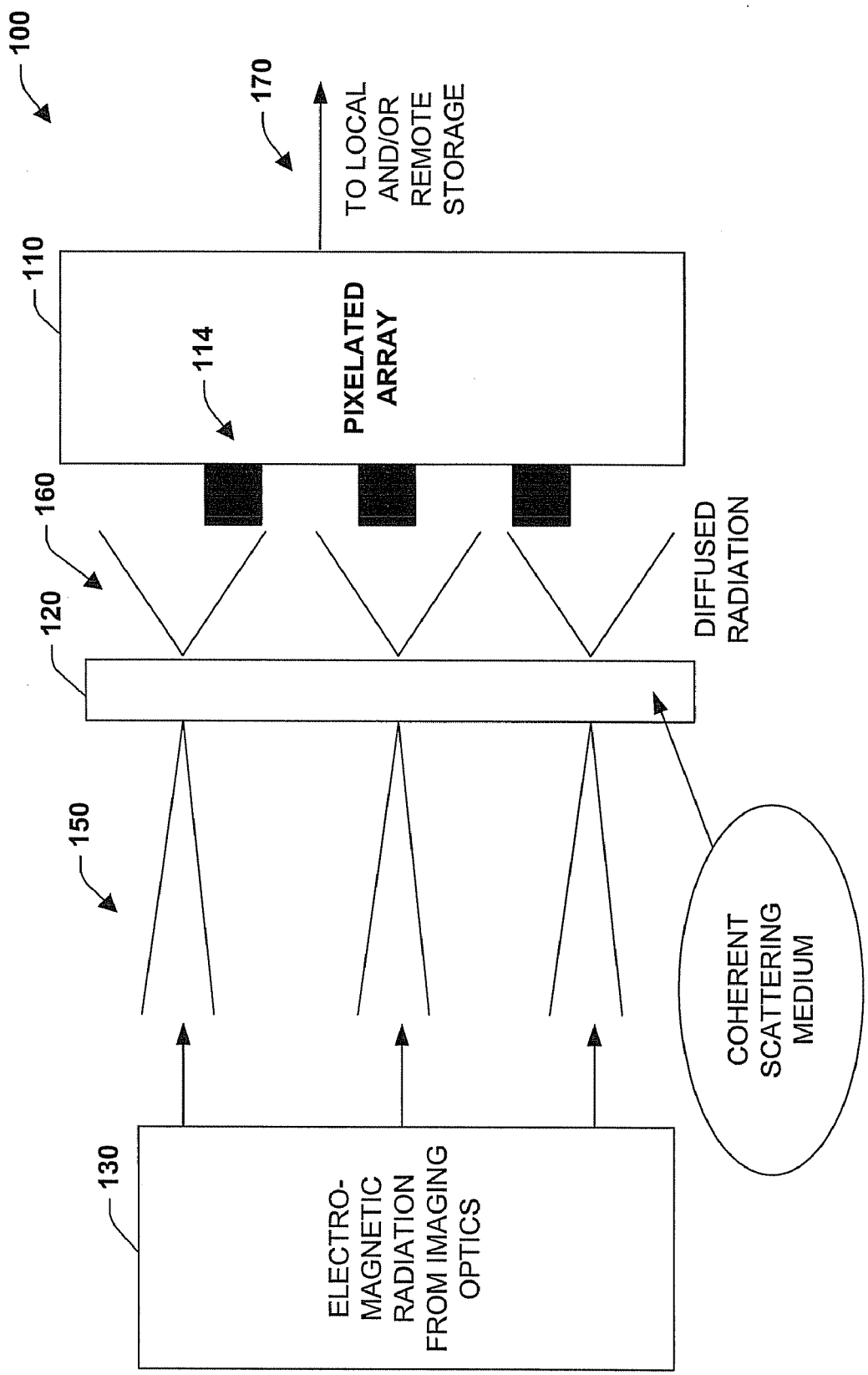
FIG. 1 is a schematic block diagram illustrating a coherent coupling system and sensor array in accordance with an aspect of the present invention.

Referring initially to FIG. 1, a coherent coupling and sensor array system 100 is illustrated in accordance with an aspect of the present invention. The system 100 includes a pixelated sensor array 110 (or array) having one or more receptors such as pixels 114 or discrete energy detectors operably associated with a coherent scattering medium 120. The coherent scattering medium 120 is adapted or configured to disperse or diffuse radiation received from a source 130 (e.g., camera lens) across the pixels 114 on the array 110. As illustrated, energy points 150 from the source 140 are diffused into e.g., conical patterns at 160. In this manner, by dispersing the energy points 150 at the array 110 via the coherent scattering medium 120, the present invention promotes an enhanced fill-factor for the array since the energy points are captured by the pixels 114 even if the points are not substantially aligned with the pixels. Thus, if the coherent scattering medium 120 were not present such as in conventional systems, the energy points or spots 150 may fall between the pixels 114 resulting in information being undetected by the array 110. It is to be appreciated that the coherent scattering medium 120 can produce shapes or patterns such as cones at 160 or other shapes that provide coherent spatial coupling between active and inactive areas of the pixelated sensor array 110.

It is noted that the pixelated sensor array 110 can be substantially any size, shape and/or technology (e.g., digital sensor, analog sensor, Charge Coupled Device (CCD) sensor, CMOS sensor, Charge Injection Device (CID) sensor, an array sensor, a linear scan sensor) including one or more receptors of various sizes and shapes, the one or more receptors being similarly sized or proportioned on a respective sensor to be responsive to energy such as light (e.g., visible, non-visible) received from the source 130. Also, the pixelated sensor array 110 can include an M by N array of pixels associated with the one or more receptors, where M and N represent integer rows and columns respectively.

As energy is received from the source 130, the array 110 provides an output 170 that can be directed to a local or remote storage such as a memory (not shown) and displayed from the memory via a processor and associated display, for example, without substantially any intervening digital processing (e.g., straight bit map from sensor memory to display), if desired. It is noted that local or remote signal processing of the image data received from the array 110 can also occur. For example, the output 170 can be converted to electronic data packets and transmitted to a remote or local system over a network (wireless or wired) for further analysis and/or display. Similarly, the output 170 can be stored in a local computer memory before being transmitted to a subsequent computing system for further analysis and/or display. Images can be transferred across the Internet (or other network) such as to a controller, e-mail address, Ethernet address, or web site, for example.

As will be described in more detail below, the coherent scattering medium 120 can be a holographic diffuser in one example that is configured to create a diffusion pattern at 160 that is less than about the size of one pixel in the pixelated sensor array 110. It is to be appreciated however, that any coherent scattering medium 120 that facilitates coherent coupling of electromagnetic energy within the proximity of the pixelated sensor array 110 is considered to be within the scope of the present invention. Also, as can be appreciated, digital output from the array 110 can be employed to perform automated analysis and/or mapped to a display to enable manual inspection of an image. Furthermore, electromagnetic radiation from the source 130 can include substantially any type of energy to activate the array 110 such as coherent light, non-coherent light, visible light and non-visible light (e.g., infrared, ultra violet). In addition, the pixelated sensor array 110 and the coherent scattering medium 120 can be associated with a plurality of applications such as a camera, a copier, a fax machine, a microscope, a telescope, a telephone, handheld device such as a PDA, computer, a watch, and a video application, for example.

Figure 2:
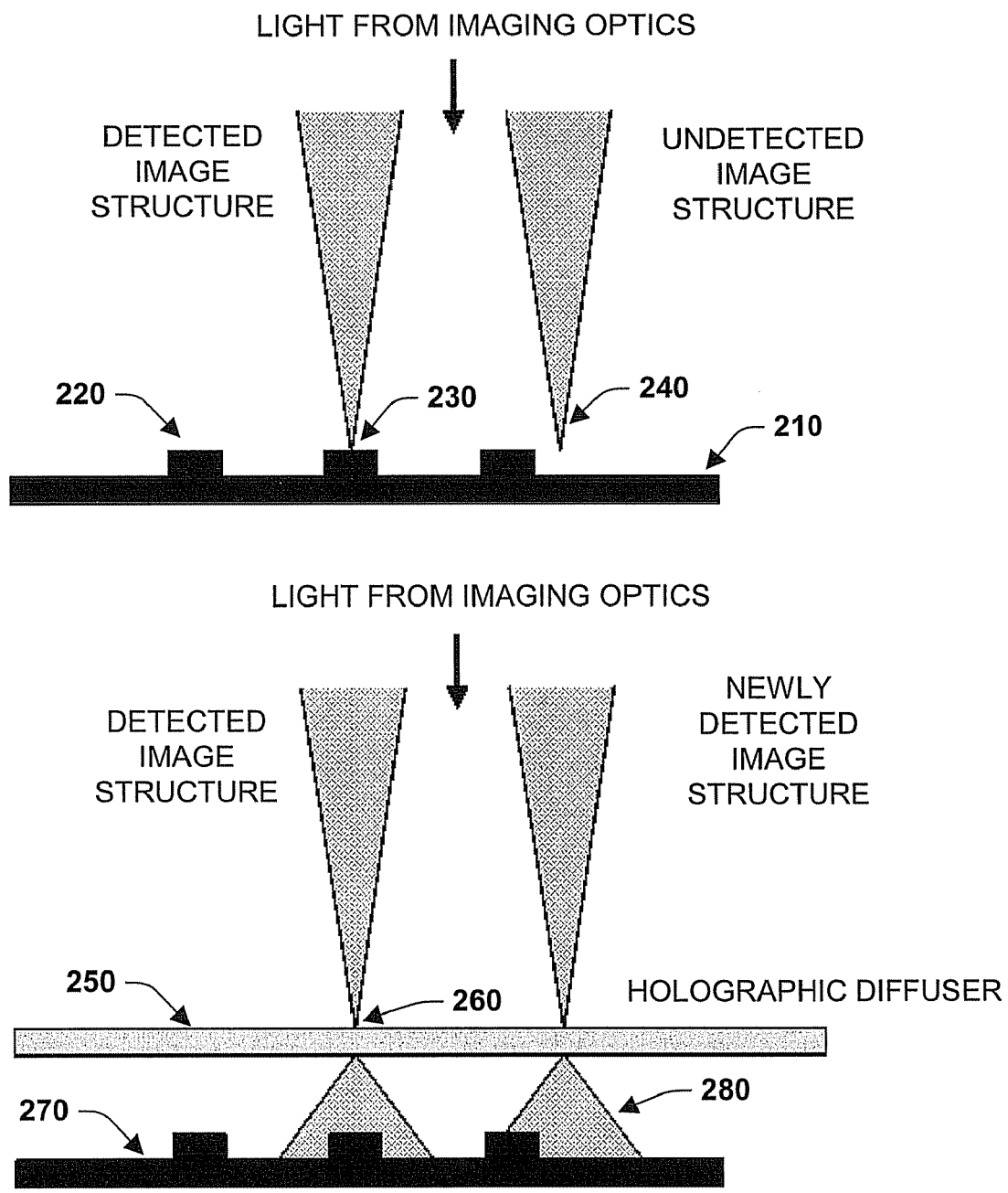
FIG. 2 illustrates holographic diffuser principles in accordance with an aspect of the present invention.

Referring now to FIG. 2, holographic diffuser principles are illustrated in accordance with an aspect of the present invention. In a "classical" design approach, such as a digital camera (or other similar instrument), the image is presented to the surface of a sensor array 210 having a plurality of pixels 220 without substantial concern towards correlating diffraction-limited spots to the array pixel-pitch, leading to a situation whereby it is possible that the image has spatial structures that are smaller than the physical size of the active portions of the pixel. This is illustrated at 230 where light (or energy) from imaging optics is captured by a sensor pixel and at reference numeral 240 where light from the imaging optics is not picked up by the active portions of the array 210. In this situation, parts of the image may well be unresolved, not due to diffraction or optical limitations, but due to the physical dimensions of the array pixels 220.

A holographic diffuser 250 can be positioned near an image plane at 260 and prior to a sensor array 270. A diffusion angle for a hologram 280 can be computed such that a minimal-sized spot in the image plane (close to diffraction limited, or at the resolving ability of the lenses) is diffused to cover about a single pixel interval on the array. Computations for the diffusion angle are described in more detail below with respect to FIG. 3. While diffusion may be somewhat achieved with a simple ground glass (or similar) diffuser, the effect will not be comparable, as one of the properties of the holographic diffuser 250 is that information present at the diffuser surface is equally (or substantially equally) distributed over the diffused spot. Thus, for example, a fine line or other feature that may normally miss the active portion of a pixel would be diffused such that the information carried in the line would be available to the active part of the pixel. A possible side-effect of this may be that sharp images are slightly blurred, but generally only to the resolution of the array (the pixel-pitch) and thus, substantially no recovered information should be lost—on the contrary, extra information should be recovered from the "dead zones" on the array via the holographic diffuser 250. Generally, no intensity should be lost, as the holographic diffuser 250 merely redistributes photon statistics, and thus, the response of the array 270 should not be compromised.

Figure 3:
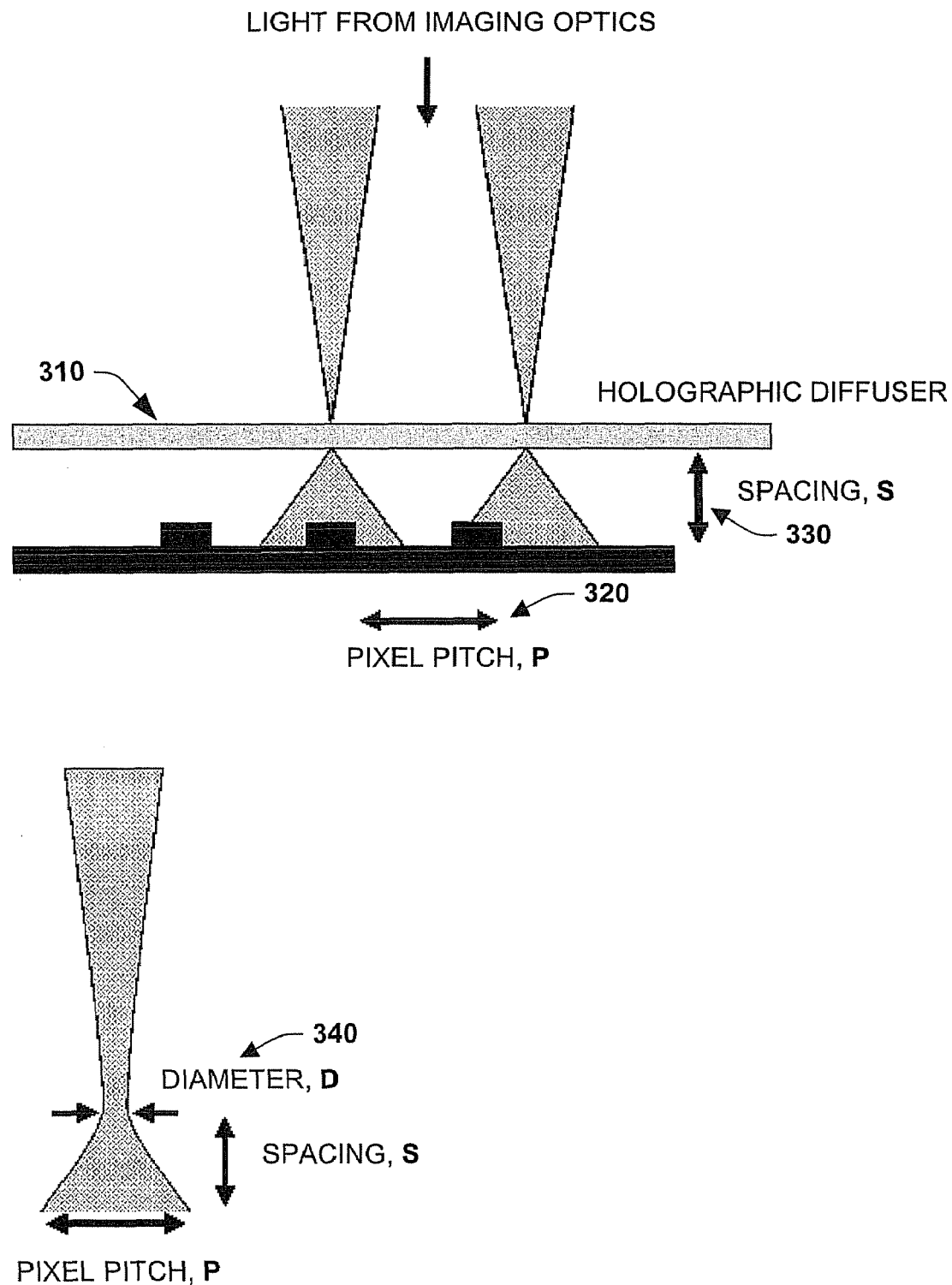
FIG. 3 illustrates holographic diffuser and sensor design parameters in accordance with an aspect of the present invention.

FIG. 3 illustrates holographic diffuser and sensor design parameters in accordance with an aspect of the present invention. A diffuser 310 can be selected in accordance with a pixel pitch parameter—(P), illustrated at 320 and a spacing parameter—(S), illustrated at 330. In this case, a diffusion half angle A, can be selected according to the following equation:

Diffusion half angle, A, where $\operatorname{Tan}(A)=(P/2)/S$.

For more precise geometry, one may account for the size of an image spot or point as a parameter (D) or diameter illustrated at 340 along with spacing (S) and pixel pitch (P). In this case, a diffusion half angle A, can be selected according to the following equation:

Diffusion half angle, A, where $\operatorname{Tan}(A)=(P-D)/(2*S)$.

Figure 4:
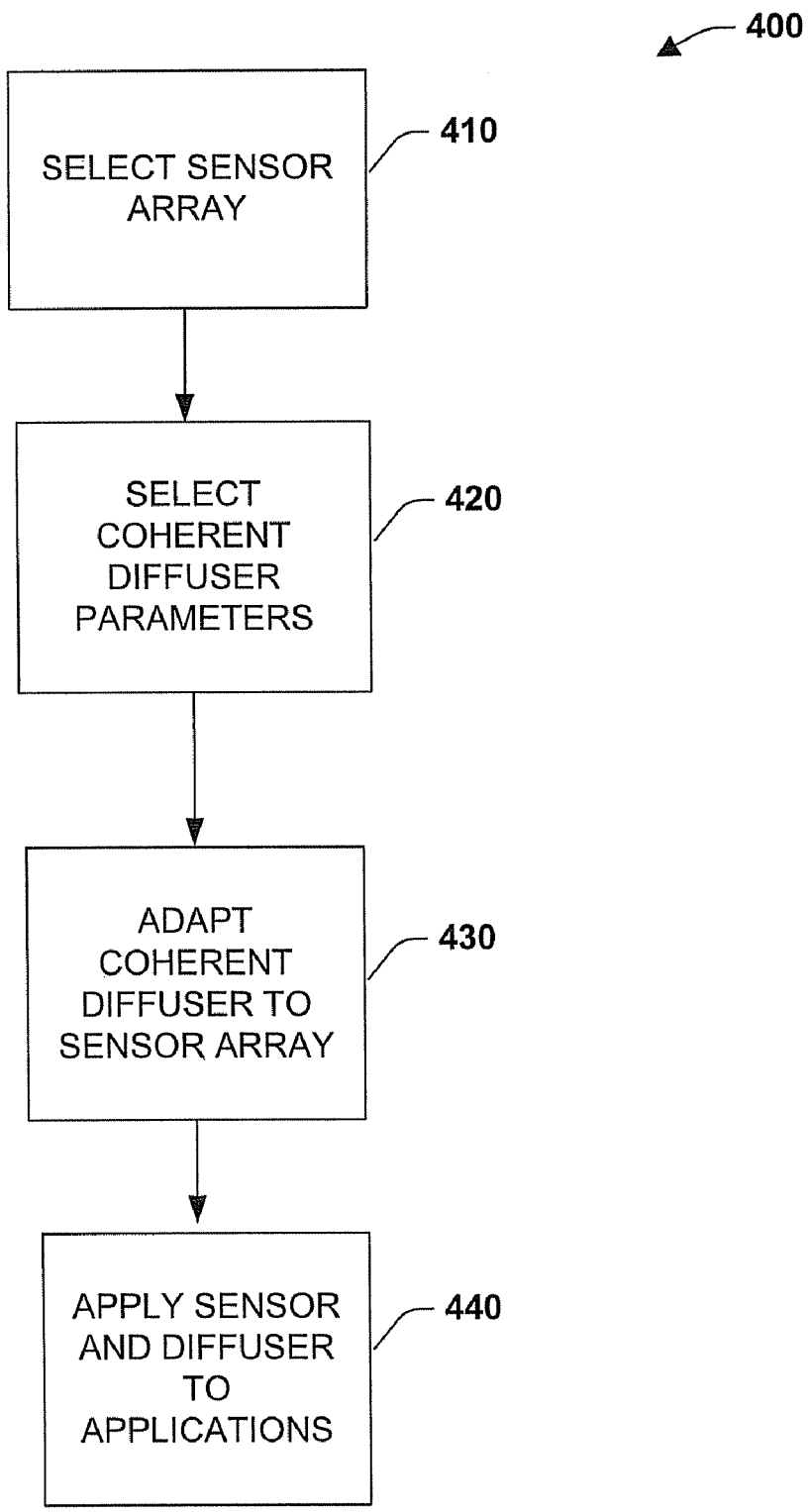
FIG. 4 is a flow diagram illustrating a coherent coupling methodology in accordance with an aspect of the present invention.

FIG. 4 illustrates a coherent coupling methodology 400 in accordance with an aspect of the present invention. While, for purposes of simplicity of explanation, the methodology is shown and described as a series of acts, it is to be understood and appreciated that the present invention is not limited by the order of acts, as some acts may, in accordance with the present invention, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the present invention.

Proceeding to 410, a sensor array is selected. As noted above, this can include substantially any type of pixelated sensor array such as a CCD sensor or a CMOS sensor for example. At 420, coherent diffuser parameters are selected. This can include determining pixel pitch dimensions (P), given the sensor characteristics, spacing (S) between the diffuser and the sensor, as well as considerations of spot size diameters (D), that may be expected at an image plane. From these parameters, a coherent diffuser such as a holographic diffuser can be selected by determining a diffusion half-angle parameter from the parameters P, S, and/or D. At 430, the coherent diffuser and the sensor are adapted to each other in accordance with the parameters described at 420. At 440, the sensor array and associated coherent diffuser are applied to one or more applications and/or devices. As previously noted, an image can be generated by outputting data from the sensor and storing the data in memory for direct display to a computer display and/or subsequent local or remote image processing and/or analysis within the memory.

In accordance with the concepts described above in relation to FIGS. 1-4, a plurality of related imaging applications can be enabled and enhanced by the present invention. For example, these applications can include but are not limited to imaging, control, inspection, microscopy, telescopes, and/or other analysis such as biomedical analysis (e.g., cell colony counting, histology, frozen sections, cellular cytology, haematology, pathology, oncology, fluorescence, interference, phase and many other clinical microscopy applications); particle sizing applications (e.g., Pharmaceutical manufacturers, paint manufacturers, cosmetics manufacturers, food process engineering, and others); air quality monitoring and airborne particulate measurement (e.g., clean room certification, environmental certification, and so forth); optical defect analysis, and other requirements for inspection of transmissive and opaque materials (as in metallurgy, semiconductor inspection and analysis, machine vision systems and so forth); and imaging technologies such as cameras, copiers, fax machines and medical systems, for example.

What has been described above are preferred aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A hand held device, comprising:
   a lens;
   a pixelated sensor responsive to electromagnetic radiation; and
   a coherent scattering medium between the lens and the pixelated sensor, the coherent scattering medium operable to redistribute photon statistics in order to increase the fill-factor of the pixelated sensor, the coherent scattering medium positioned relative to the pixelated sensor via the following equation: $\operatorname{Tan}(A)=(P/2)/S$, wherein A represents a diffusion half angle, P represents a pixel pitch, and S represents a spacing between the coherent scattering medium and the pixelated sensor.

2. The hand held device of claim 1, the coherent scattering medium comprises a holographic diffuser.

3. The hand held device of claim 1, the pixelated sensor comprising pixels having a size, the coherent scattering medium configured to create a diffusion pattern that is less than about the size of one pixel in the pixelated sensor.

4. The hand held device of claim 1, the hand held device is a camera.

5. The hand held device of claim 1, the hand held device is a telephone.

6. The hand held device of claim 1, the coherent scattering medium is associated with the pixelated sensor via the following equation: $\operatorname{Tan}(A)=(P-D)/(2*S)$, wherein A represents a diffusion half angle, P represents a pixel pitch, S represents a spacing between the coherent scattering medium and the pixelated sensor, and D represents a size of an image spot.

7. The hand held device of claim 1, the coherent scattering medium is operable to provide coherent spatial coupling between active areas and inactive areas of the pixelated sensor.

8. The hand held device of claim 1, the pixelated sensor comprising at least one of a digital sensor, an analog sensor, a CCD sensor, a CMOS sensor, a CID sensor, an array sensor, and a linear scan sensor.

9. The hand held device of claim 1, further comprising a processor and a memory to receive an output from the pixelated sensor, the processor storing the output in the memory.

10. The hand held device of claim 9, the processor performing automated analysis of the output in the memory.

11. The hand held device of claim 9, the processor mapping the memory to a display to enable manual inspection of an image.

12. The hand held device of claim 9, the output is transmitted across a wireless or wired network to a local or a remote location.

13. The hand held device of claim 12, the local or remote location is associated with an Internet address.

14. The hand held device of claim 1, the electromagnetic radiation includes at least one of coherent light, non-coherent light, visible light and non-visible light.

15. A method of increasing fill-factor in a hand held device, comprising:
   positioning a coherent scattering medium between a lens and a pixelated sensor to redistribute photon statistics in order to increase the fill-factor of the pixelated sensor, the coherent scattering medium positioned relative to the pixelated sensor via the following equation: $\operatorname{Tan}(A)=(P/2)/S$, wherein A represents a diffusion half angle, P represents a pixel pitch, and S represents a spacing between the coherent scattering medium and the pixelated sensor.

16. The method of claim 15, comprising employing the lens, the pixilated sensor, and the coherent scattering medium with at least one of a camera, a telephone and a video application.

17. The method of claim 15, further comprising positioning the coherent scattering medium relative to the pixelated sensor via the following equation: $\operatorname{Tan}(A)=(P-D)/(2*S)$, wherein A represents a diffusion half angle, P represents a pixel pitch, S represents a spacing between the coherent scattering medium and the pixelated sensor, and D represents a size of an image spot.

18. The method of claim 15, the coherent scattering medium comprises a holographic diffuser.

19. A digital camera, comprising:
a lens;
a pixelated sensor; and
a coherent scattering medium between the lens and the pixelated sensor, the coherent scattering medium operable to redistribute photon statistics in order to increase the fill-factor of the pixelated sensor, the coherent scattering medium positioned relative to the pixelated sensor via the following equation: $\operatorname{Tan}(A)=(P/2)/S$, wherein A represents a diffusion half angle, P represents a pixel pitch, and S represents a spacing between the coherent scattering medium and the pixelated sensor.

20. The digital camera of claim 19, the coherent scattering medium comprising a holographic diffuser and the pixelated sensor comprising a CCD sensor or a CMOS sensor.

* * * * *